United States Patent
Tanabe et al.

(10) Patent No.: US 6,664,479 B2
(45) Date of Patent: Dec. 16, 2003

(54) FLEXIBLE PRINTED CIRCUIT BOARD

(75) Inventors: Nobuo Tanabe, Tokyo (JP); Kenichi Okada, Tokyo (JP); Yukihiko Kurosawa, Tokyo (JP); Takayuki Imai, Tokyo (JP); Sadamitsu Jumonji, Tokyo (JP); Masahiko Arai, Tokyo (JP); Masahiro Kaizu, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 09/844,097

(22) Filed: Apr. 27, 2001

(65) Prior Publication Data

US 2002/0189855 A1 Dec. 19, 2002

(51) Int. Cl.⁷ .................................................. H05K 1/00
(52) U.S. Cl. ........................ 174/254; 174/250; 174/259
(58) Field of Search .................... 174/250, 254, 174/258–260, 255; 361/748–751, 792–795, 736–737, 746, 762–764; 248/208, 209

(56) References Cited

U.S. PATENT DOCUMENTS

| | | | |
|---|---|---|---|
| 4,913,955 A | * 4/1990 | Noda et al. | 174/254 |
| 5,273,439 A | * 12/1993 | Szerlip et al. | 439/66 |
| 5,296,651 A | * 3/1994 | Gurrie et al. | 174/250 |
| 5,516,989 A | * 5/1996 | Uedo et al. | 174/250 |
| 5,837,380 A | 11/1998 | Choi et al. | |
| 6,027,958 A | * 2/2000 | Vu et al. | 438/110 |
| 6,075,423 A | * 6/2000 | Saunders | 333/33 |
| 6,181,569 B1 | * 1/2001 | Chakravorty | 361/761 |
| 6,197,433 B1 | * 3/2001 | Hatano | 428/606 |
| 6,204,454 B1 | * 3/2001 | Gotoh et al. | 174/255 |
| 6,233,821 B1 | * 5/2001 | Takahashi et al. | 29/847 |
| 6,238,802 B1 | * 5/2001 | Leeb | 428/458 |
| 6,274,225 B1 | * 8/2001 | Miyake et al. | 174/254 |
| 6,333,466 B1 | * 12/2001 | Miyaake et al. | 174/254 |
| 6,372,061 B1 | * 4/2002 | Hatano et al. | 148/432 |
| 6,410,857 B1 | * 6/2002 | Gonya | 174/254 |

FOREIGN PATENT DOCUMENTS

| | | |
|---|---|---|
| JP | 6-232553 | 8/1994 |
| JP | 11-135902 | 5/1999 |
| JP | 11-199842 | 7/1999 |
| JP | 2001-15876 | 1/2001 |

OTHER PUBLICATIONS

Yasufumi Miyake, Shiro Mazaki, "Evaluation of High Heat Resistant Flexible Printed Circuit Board", Nitto Gihoh Technical Report, vol. 30, No. 1, May 1992, pp. 32–36.

Chiharu Miyaake, "Flexural Fatigue Life Evaluation for Flexible Printed Circuit Boards at High Temperature", Nitto Technical Report, vol. 37, No. 2, Nov. 1999, pp. 37–38.

* cited by examiner

Primary Examiner—David L. Talbott
Assistant Examiner—Tuan Dinh
(74) Attorney, Agent, or Firm—Bell, Boyd & Lloyd LLC

(57) ABSTRACT

A flexible printed circuit board (FPC) comprises a base film; a base film side adhesive layer provided on the base film; a metal foil layer on which a pattern circuit is formed, provided on the base film side adhesive layer; and a cover layer side adhesive layer provided on the metal foil layer, wherein at least one of the base film side adhesive and the cover layer side adhesive layer has a higher glass transition temperature than an operating temperature of the flexible printed circuit board, so that the FPC has a stable flexibility at high temperature.

15 Claims, 1 Drawing Sheet

FLEXIBLE PRINTED CIRCUIT BOARD

BACKGROUND OF THE INVENTION

1. Field of the Invention

The present invention relates to a flexible printed circuit board (FPC) having excellent flexibility under high temperature.

This application is based on Japanese Patent Application No. Hei 11-320104, the contents of which are incorporated herein by reference.

2. Description of Related Art

Referring to FIG. 1, a flexible printed circuit board (FPC) is generally prepared by providing a base film side adhesive layer 2 on a base film 1, providing a metal foil layer 3, on which a pattern circuit is formed, on the base film side adhesive layer 2, and applying a cover layer film 5 on which a cover layer side adhesive layer 4 is applied.

The base film 1 is conventionally composed of a flexible film such as polyimide resin, polyethylene terephthalate resin (PET), and the like. Generally, a metal foil laminated film (Copper Composite Laminate (CCL)) which is prepared beforehand by attaching/applying the metal foil layer 3 to the whole base film 1 with the base film side adhesive layer 2 therebetween. A desired pattern circuit is formed on the metal foil layer 3 using a technique such as lithography and the like. The cover layer (Cover Layer (CL)) film 5 is a flexible film composed of, for example, polyimide resin, polyethylene terephthalate resin (PET), and the like. The cover layer side adhesive layer 4 is applied on one side of the cover layer film 5 and the cover layer film 5 is bonded to the base film 1 through the base film side adhesive layer 2 and the metal foil layer 3.

The obtained FPC often has a thickness approximately 0.1 mm or less and superior flexibility. Recently, the FPC is often used as a circuit board for a movable portion of various electronic devices, for example, a hard disk drive (HDD) which is a data storage device for a personal computer. The HDD may be used as a picture recorder for a household video tape recorder (VTR), a data recorder for a digital camera, a data recorder for a car navigation system, and the like.

For the FPC which is used for a movable portion of the HDD, in order to obtain the above-mentioned superior (high) flexibility, it is necessary that the FPC has certain characteristics: (1) minimal peeling between a metal foil layer and an adhesive layer, and between the adhesive layer and a film, and (2) the base film layer and the base film side adhesive layer should have suitable flexibility (storage modulus) and minimal generation of local distortion at the metal foil layer. As an adhesive for an FPC, conventionally, epoxy resin adhesive is often used as an adhesive having both high adhesion and storage modulus.

In the above-mentioned recent electronic devices, due to the higher performance of various parts and elements, in particular, a CPU, their calorific values remarkably increase, and accordingly, temperatures in the electronic devices increase. For example, in a notebook personal computer various parts are densely mounted in its limited space, and as a result, a temperature in the computer sometimes rises to approximately 80° C. when continuously used.

Since the conventional normal HDD is made on the assumption that the HDD is used under ordinary temperature (approximately 25° C.), when an inner temperature increases, for example, to 80° C. as described above, the flexibility of the FPC used in the HDD remarkably decreases.

The inventors of the present invention have diligently carried out research with regard to the flexibility decreasing depending on the rise in temperature, as described above, and found that there is a problem in the adhesive used in the FPC.

In an ordinary FPC, an epoxy resin adhesive is adopted in general as the base film side adhesive or the cover layer side adhesive. The epoxy resin adhesive is adjusted by adding a suitable amount of a hardening agent, a plasticizer, a flame retarder, or the like into the epoxy resin so that the epoxy resin adhesive has (1) a small coefficient of shrinkage when hardening, (2) a high peeling intensity (adhesion), (3) suitable flowability before hardening, (4) excellent electrical properties after hardening, and the like, and (5) the epoxy resin adhesive is prepared in low cost.

However, even if the epoxy resin adhesive has the above-mentioned properties, as an operating temperature rises, for example, the ordinary temperature rises to approximately 50° C., the epoxy resin adhesive softens and its storage modulus tends to decrease. When the temperature rises to 60° C. or higher, the resin remarkably softens and its storage modulus strikingly decreases.

By decreasing the storage modulus of the resin part in the FPC, partial distortion occurs easily at each part between layers (films and metal foil layer) of the FPC and, as a result, flexibility of the FPC decreases.

BRIEF SUMMARY OF THE INVENTION

In light of the above-mentioned problems, an object of the present invention is to provide an FPC which has excellent stable flexibility by using an adhesive having a glass transition temperature (Tg) which is higher than an operating temperature of a circuit board.

To achieve the above object, a first aspect of the present invention provides a flexible printed circuit board comprising a base film; a base film side adhesive layer provided on the base film; a metal foil layer on which a pattern circuit is formed, provided on the base film side adhesive layer; and a cover layer side adhesive layer provided on the metal foil layer, wherein at least one of the base film side adhesive and the cover layer side adhesive layer has a higher glass transition temperature than an operating temperature of the flexible printed circuit board.

In the flexible printed circuit board, the glass transition temperature may be 60° C. or higher.

Furthermore, in the flexible printed circuit board, the glass transition temperature may be 80° C. or higher.

Furthermore, in the flexible printed circuit board, at least one of the base film side adhesive layer and the cover layer side adhesive layer may be made of an epoxy resin adhesive.

Furthermore, in the flexible printed circuit board, the bending life of the flexible printed circuit board may be ten million times or greater per minute at 60° C.

Furthermore, in the flexible printed circuit board, the bending life of the flexible printed circuit board may be between a million times and ten million times per minute at 80° C.

According to the above-mentioned aspect, in FPCs of the present invention, since at least one of the base film side adhesive layer and the cover layer side adhesive layer has a higher glass transition temperature than the operating temperature of the flexible printed circuit board, softening of the adhesive itself is prevented, and as a result, high flexibility is obtained. Particularly, when the glass transition temperature of the adhesive to be used is adjusted to 60° C. or higher, preferably, 80° C. or higher, even if an operating temperature, such as in the case of the current high density packaged type electronic device, rises to 50° C. or higher, an FPC which is stable during use is provided.

DETAILED DESCRIPTION OF THE INVENTION

Figure 3:
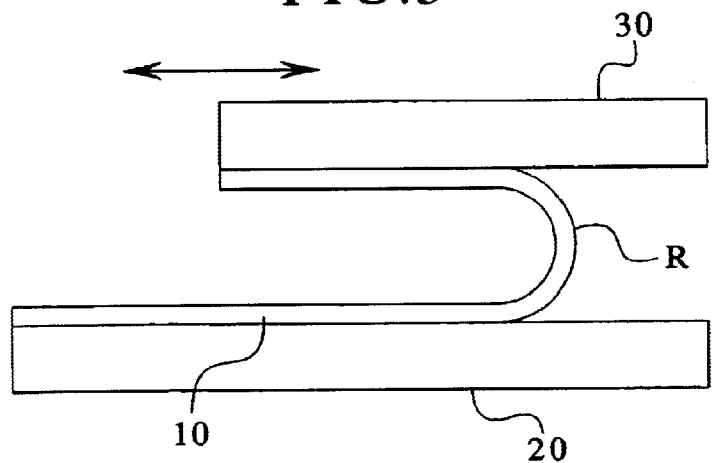
FIG. 3 is a schematic view showing the FPC of the present invention and a method for fatigue test of the FPC of the present invention.

The FPC 10 of the present invention whose basic structure is shown in FIG. 3 is prepared by providing a base film side adhesive layer 12 on a base film 11, providing a metal foil layer 13, on which a pattern circuit is formed, on the base film side adhesive layer 12, and adhering a cover layer film 15 on which a cover layer side adhesive layer 14 is applied.

Furthermore, at least one adhesive used in either the base film side adhesive layer a 12 or the cover layer side adhesive layer 14 is an epoxy resin adhesive and the epoxy resin adhesive is adjusted so that its glass transition temperature (Tg) is higher than an operating temperature.

When the glass transition temperature (Tg) of the adhesive 12 or 14 is adjusted so as to be higher than an operating temperature, it is controlled so that the adhesive softens at operating temperature, and therefore peeling between layers is prevented. Particularly, almost no local distortion to the metal foil layer 13 on which the pattern circuit is formed is generated, and therefore, flexibility is stably obtained.

As described above, the epoxy resin adhesive is usually prepared by adding a suitable amount of a hardening agent, a plasticizer, a flame retarder, or the like to an epoxy resin while the glass transition temperature of the adhesive of the present invention is adjusted as follows.

(1) The epoxy resin having a short chain between functional groups or multifunctional epoxy resin is selected as an epoxy resin to be used and the crosslinking density of the epoxy resin is increased.

(2) The epoxy resin having either an aliphatic or an aromatic group which rigidly bonds to a main chain is selected.

(3) The epoxy resin having a linear main chain and symmetrical shape is selected.

(4) The hardening agent having a short molecular chain between functional groups so as to provide high crosslinking density is selected.

(5) The epoxy resin and the hardening agent are mixed in a stoichiometrical equivalent mix proportion.

(6) A post-hardening treatment is conducted in a system such that an amount of the hardening agent is larger than the stoichiometrical equivalent of the epoxy resin.

According to these methods, the glass transition temperature can be adjusted to be higher than an operating temperature, for example, 60° C. or higher, preferably, from 80° C. to 120° C.

EXAMPLE

An example of the present invention will be explained in detail while comparing to comparative examples as follows. FIG. 3 is a schematic diagram showing a method of fatigue test of the present invention.

In the fatigue test, an upper member 30 and a lower member 20 are provided in parallel and an end of a sample FPC 10 to be an object for the test is bonded to the upper member 30 and another end of the sample FPC 10 is bonded to the lower member 20 so that the non-bonded part of the sample FPC 10 has a flexural radius R of 2 mm. The lower member 20 is fixed while the upper member 30 is reciprocated in parallel to the lower member 20 with a 20 mm stroke at the rate of 1500 times a minute. During the reciprocation, the fluctuation of the value of resistance in the pattern circuit of the FPC is measured. The sample FPC 10 is defined as having achieved the fatigue life when the value of resistance increases 10% from the initial value of resistance.

The structure of each sample FPC is shown in FIG. 3. The base film 11 and the cover layer film 15 of each FPC 10 is made of a polyimide resin film and the thickness of each film is 25 μm. The thickness of each adhesive layer is 15 μm the thickness of the metal foil layer 13 on which the pattern circuit is formed is 36 μm.

Table 1 shows the relation between glass transition temperatures (Tg) of the adhesives to be used and the storage modulus of the adhesive layer at the test temperature (within ordinary temperature at 90° C.) which is assumed to be an operating temperature, including the FPC of the example of the present invention (examples 1 to 3) and the FPC of the comparative example (comparative examples 1 and 2). The FPC of each example (examples 1 to 3) according to the present invention uses the epoxy resin adhesive as an adhesive for the base film side (CCL side) adhesive layer 12 and the cover layer side (CL side) adhesive layer 14, wherein the glass transition temperature of the epoxy resin adhesive is higher than that of the ordinary epoxy resin adhesive. The FPC of each comparative example (comparative examples 1 and 2) uses the ordinary adhesive which has been used.

Furthermore, the storage modulus E is calculated by the dynamic viscoelasticity method. When $0.8 \leq E$, the storage modulus is shown as very good (O), when $0.1 \leq E < 0.8$, it is shown as good (Δ), and when $E < 0.1$, it is shown as no good (x).

TABLE 1

| | | | Storage modulus | | | | |
|---|---|---|---|---|---|---|---|
| | Adhesive layer | Tg (° C.) | 25° C. or lower | 50° C. or lower | 60° C. or lower | 80° C. or lower | 90° C. or lower |
| Example 1 | CL side | 64 | O | O | Δ | X | X |
| | CCL side | 68 | O | O | Δ | X | X |

TABLE 1-continued

|  | Adhesive layer | Tg (° C.) | Storage modulus | | | | |
|---|---|---|---|---|---|---|---|
|  |  |  | 25° C. or lower | 50° C. or lower | 60° C. or lower | 80° C. or lower | 90° C. or lower |
| Example 2 | CL side | 82 | ○ | ○ | ○ | Δ | X |
|  | CCL side | 85 | ○ | ○ | ○ | Δ | X |
| Example 3 | CL side | 110 | ○ | ○ | ○ | ○ | ○ |
|  | CCL side | 117 | ○ | ○ | ○ | ○ | ○ |
| Comparative example 1 | CL side | 38 | ○ | X | X | X | X |
|  | CCL side | 42 | ○ | X | X | X | X |
| Comparative example 2 | CL side | 52 | ○ | Δ | X | X | X |
|  | CCL side | 55 | ○ | Δ | X | X | X |

Figure 1:
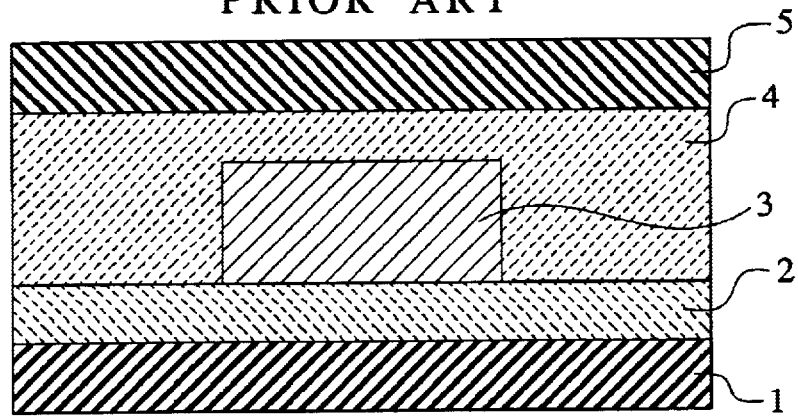
FIG. 1 is a longitudinal sectional view of a schematic structure of an FPC of the conventional art.
Figure 2:
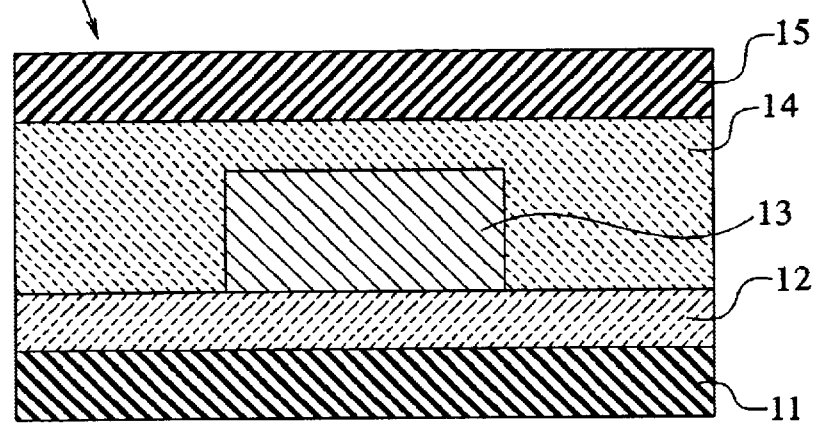
FIG. 2 is a longitudinal sectional view of a schematic structure of an FPC of the present invention.

FIG. 1 shows that the storage modulus, which is an index of flexibility in the adhesive layer, rapidly decreases as soon as the test temperature passes through the glass transition temperature.

In the FPC of the examples according to the present invention (examples 1 to 3), since each adhesive used has a high glass transition temperature, even if an operating temperature rises to approximately 50° C., the storage modulus maintains a very good condition. Furthermore, as the glass transition temperature of the adhesive is adjusted higher, the FPC can tolerate higher operating temperatures.

Table 2 show the relation between glass transition temperature (Tg) of the adhesives to be used and bending life (fatigue life) when the fatigue test is conducted at the test temperature (within ordinary temperature to 90° C.), which is assumed to be an operating temperature, including the FPC of the example of the present invention (examples 1 to 3) and the FPC of the comparative example (comparative examples 1 and 2).

In example 4 of the present invention, the CCL side adhesive used in the above example 3 is used as the base film side (CCL side) adhesive and the CL side adhesive used in the above comparative example 1 is used as the cover layer side (CL side) adhesive. In example 5 of the present invention, the CCL side adhesive used in the above comparative example 1 is used as the base film side (CCL side) adhesive and the CL side adhesive used in the above example 3 is used as the cover layer side (CL side) adhesive.

Furthermore, the bending life (fatigue life) is indicated with the reciprocation number N of the upper member until the FPC achieves the fatigue life by the fatigue test. When ten million≦N, it is shown as very good (0), when one million≦N <ten million, it is shown as good (Δ), and N<one million, it is shown as no good (x).

TABLE 2

|  | Adhesive layer | Tg (° C.) | Bending life (Fatigue life) | | | | |
|---|---|---|---|---|---|---|---|
|  |  |  | 25° C. or lower | 50° C. or lower | 60° C. or lower | 80° C. or lower | 90° C. or lower |
| Example 1 | CL side | 64 | ○ | ○ | Δ | X | X |
|  | CCL side | 68 |  |  |  |  |  |
| Example 2 | CL side | 82 | ○ | ○ | ○ | Δ | X |
|  | CCL side | 85 |  |  |  |  |  |
| Example 3 | CL side | 110 | ○ | ○ | ○ | ○ | ○ |
|  | CCL side | 117 |  |  |  |  |  |
| Example 4 | CL side | 38 | ○ | ○ | Δ | Δ | Δ |
|  | CCL side | 117 |  |  |  |  |  |
| Example 5 | CL side | 110 | ○ | ○ | Δ | Δ | Δ |
|  | CCL side | 42 |  |  |  |  |  |
| Comparative example 1 | CL side | 38 | ○ | X | X | X | X |
|  | CCL side | 42 |  |  |  |  |  |
| Comparative example 2 | CL side | 52 | ○ | Δ | X | X | X |
|  | CCL side | 55 |  |  |  |  |  |

According to Table 2, in FPCs of comparative examples 1 and 2, since the adhesives which have low glass transition temperatures are used, when an operating temperature exceeds each of the glass transition temperatures of the adhesives, the flexibility remarkably decreases and each bending life (fatigue life) of the FPCs becomes under ten million times.

On the other hand, in the FPCs of examples 1 to 3 of the present invention, since the adhesives which have higher glass transition temperatures than the comparative examples are used, unless the operating temperature exceeds each glass transition temperature of the adhesives, excellent flexibility is obtained.

Furthermore, the FPCs of examples 4 and 5 are adjusted so that either the base film side adhesive or the cover layer side adhesive has a high glass transition temperature and the other adhesive has a relatively low glass transition temperature. As long as at least one adhesive has a glass transition temperature which exceeds the operating temperature, any remarkable decrease in the flexibility is prevented.

As described above, the embodiments of the present invention are explained in detail with reference to the figures and tables; however, the specific configuration is not limited to these embodiments and can comprise other designs which are within the scope of the present invention.

What is claimed is:

1. A flexible printed circuit board comprising a base film; a base film side adhesive layer provided on the base film; a metal foil layer on which pattern circuit is formed, provided on the base film side adhesive layer; and a cover layer side adhesive layer provided on the metal foil layer, wherein at least one of the base film side adhesive layer and the cover layer side adhesive layer has a higher glass transition temperature than an operating temperature of the flexible printed circuit board, and wherein a reciprocation number N indicating a bending life of the flexible printed circuit board is at least ten million times at 60° C.

2. A flexible printed circuit board according to claim 1, wherein the glass transition temperature is 60° C. or higher.

3. A flexible printed circuit board according to claim 1, wherein the glass transition temperature is 80° C. or higher.

4. A flexible printed circuit board according to claim 1, wherein at least one of the base film side adhesive layer and the cover layer side adhesive layer is made of an epoxy resin adhesive.

5. A flexible printed circuit board according to claim 1, wherein a reciprocation number N indicating a bending life of the flexible printed circuit board is between a million times and ten million times at 80° C.

6. A flexible printed circuit board according to claim 1, wherein at least one of the base film side adhesive layer and the cover layer side adhesive layer has a storage modulus of 0.1 GPa or more.

7. A flexible printed circuit board according to claim 1, wherein the glass transition temperature of at least one of the base film side adhesive layer and the cover layer side adhesive layer is 117° C. or lower.

8. A flexible printed circuit board according to claim 5, wherein the glass transition temperature of at least one of the base film side adhesive layer and the cover layer side adhesive layer is 117° C. or lower.

9. A flexible printed circuit board comprising a base film; a base film side adhesive layer provided on the base film; a metal foil layer on which pattern circuit is formed, provided on the base film side adhesive layer; and a cover layer side adhesive layer provided on the metal foil layer, wherein at least one of the base film side adhesive layer and the cover layer side adhesive layer has a higher glass transition temperature than an operating temperature of the flexible printed circuit board, and wherein a reciprocation number N indicating a bending life of the flexible printed circuit board is between a million times and ten million times at 80° C.

10. A flexible printed circuit board according to claim 9, wherein the glass transition temperature is 60° C. or higher.

11. A flexible printed circuit board according to claim 9, wherein the glass transition temperature is 80° C. or higher.

12. A flexible printed circuit board according to claim 9, wherein at least one of the base film side adhesive layer and the cover layer side adhesive layer is made of an epoxy resin adhesive.

13. A flexible printed circuit board according to claim 9, wherein at least one of the base film side adhesive layer and the cover layer side adhesive layer has a storage modulus of 0.1 GPa or more.

14. A flexible printed circuit board according to claim 9, wherein the glass transition temperature of at least one of the base film side adhesive layer and the cover layer side adhesive layer is 117° C. or lower.

15. A flexible printed circuit board according to claim 13, wherein the glass transition temperature of at least one of the base film side adhesive layer and the cover layer side adhesive layer is 117° C. or lower.

* * * * *